(12) United States Patent
Garcia et al.

(10) Patent No.: US 6,204,464 B1
(45) Date of Patent: Mar. 20, 2001

(54) ELECTRONIC COMPONENT HANDLER

(76) Inventors: Douglas J. Garcia, 11495 Alps Way, Escondido, CA (US) 92026; Martin J. Twite, III, 10825 Elderwood La., San Diego, CA (US) 92131

( * ) Notice: Subject to any disclaimer, the term of this patent is extended or adjusted under 35 U.S.C. 154(b) by 0 days.

(21) Appl. No.: 09/344,428

(22) Filed: Jun. 25, 1999

Related U.S. Application Data

(60) Provisional application No. 60/090,023, filed on Jun. 19, 1998.

(51) Int. Cl.$^7$ .................................................. B07C 5/344
(52) U.S. Cl. ...................... 209/574; 209/602; 209/643; 209/919; 209/932; 324/757; 324/158.1
(58) Field of Search .................................. 209/571, 573, 209/574, 600, 601, 602, 604, 643, 644, 919, 932; 324/158.1, 755, 757, 754, 762

(56) References Cited

U.S. PATENT DOCUMENTS

| | | | |
|---|---|---|---|
| 4,354,602 | * 10/1982 | Miyoshi et al. | 209/919 X |
| 5,568,870 | * 10/1996 | Utech | 209/573 |
| 6,025,567 | * 2/2000 | Brooks | 209/574 |
| 6,040,705 | * 3/2000 | Garcia et al. | 324/762 |

FOREIGN PATENT DOCUMENTS

427611 * 5/1991 (EP) ...................... 209/574

* cited by examiner

Primary Examiner—Tuan N. Nguyen
(74) Attorney, Agent, or Firm—John J. Muprhey

(57) ABSTRACT

A high-speed handler for receiving a heap of randomly oriented parallel piped-shaped ceramic components, each component of the type having at least one set of metal terminations located on opposite edges thereof, presenting them in individual seats in controlled orientation for electrical parametric testing, and sorting them according to their test results, including a rotating feed wheel, mounted on a central shaft and defined by an outer rim concentric with the axis of the central shaft, the wheel inclined to the horizontal and including an upper surface on which to receive a heap of randomly oriented ceramic components, a plurality of radially-pointing, spaced-apart bosses extending upward and outward on the upper wheel surface terminating at component-sized cavities formed in the wheel adjacent the outer rim and arranged to receive therein a single ceramic component in specific orientation, a rotating carrier plate mounted planar to and spaced-apart from the feed wheel having an upwardly extending circular peripheral wall arranged in tangential adjacency and synchronous peripheral velocity with the feed wheel, the peripheral wall having formed therein a plurality of test seat notches in spaced-apart arrangement and adjacent alignment with the cavities in the feed wheel, the notches of a size and shape to receive a ceramic component therein with its opposed terminals facing inward and outward from the wall, first vacuum pressure device to draw the ceramic component radially from the cavity into the test seat notch and a second vacuum pressure device to hold the component in the test seat notch during further rotation of the carrier plate, a device for testing including at least one roller assembly arranged to contact the terminals of the ceramic components as they are moved in the test seat notches on the carrier plate, and a device for separately ejecting the ceramic components from the test seat notches and transferring them to separate locations according to their test results.

18 Claims, 9 Drawing Sheets

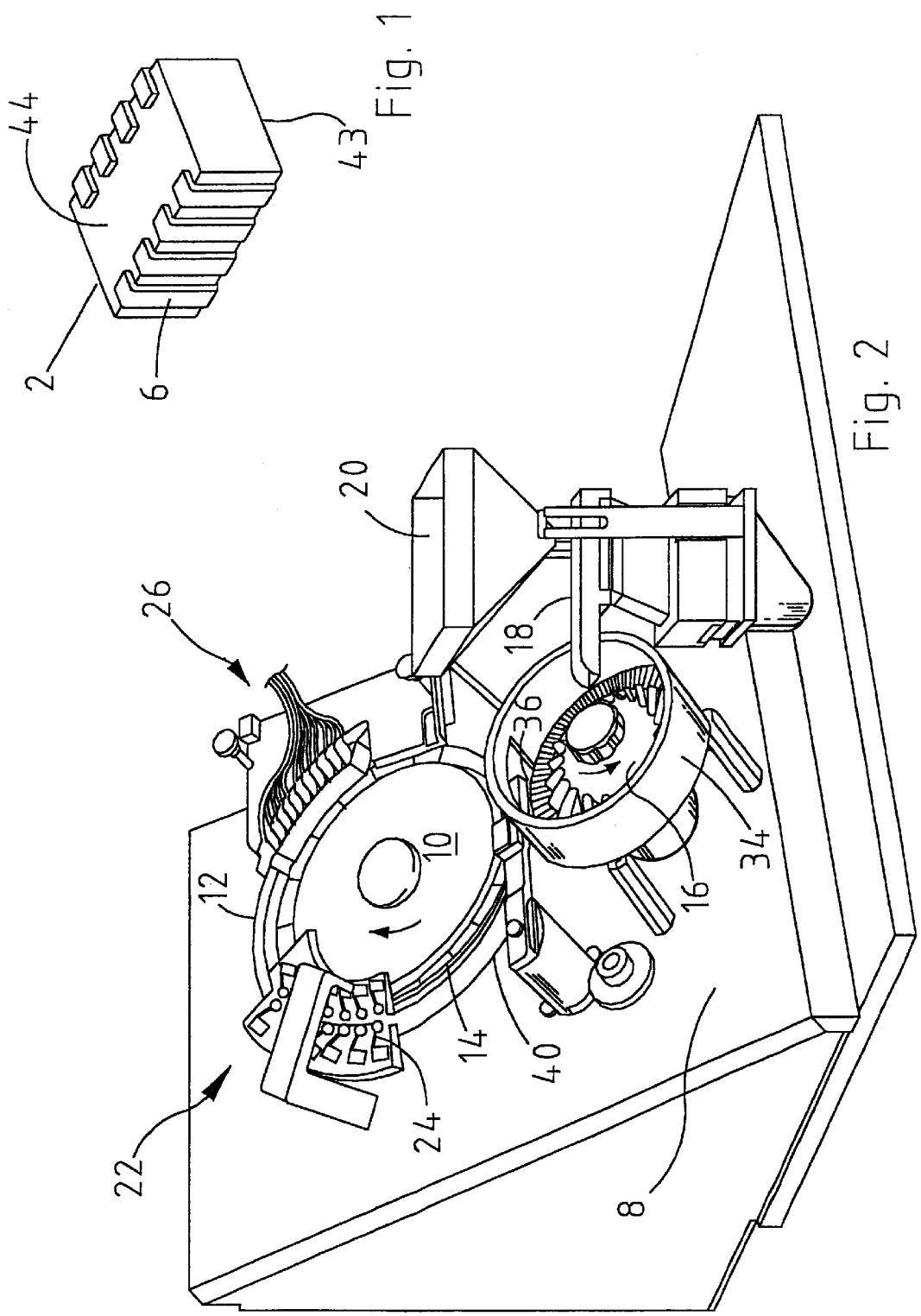

ELECTRONIC COMPONENT HANDLER

This patent application relates to our provisional patent application titled "ELECTRONIC COMPONENT HANDLER" filed Jun. 19, 1998 and given Ser. No. 60/09,023.

BACKGROUND OF THE INVENTION

This invention relates in general to apparatuses commonly called "handlers" which receive heaps of components made for use in electronic circuits, for example ceramic capacitors, and present them to a tester for parametric testing, and which subsequently sort the components according to test results. As used herein the term "component" refers to ceramic capacitors and any other electronic or electrical device having a form that allows it to be handled by this invention.

The handler according to this invention is a significant advance over the prior art. It eliminates manual seating of components for test purposes and manual sorting afterwards. It handles a greater quantity of components per unit time than prior art handlers. It handles components having multiple pairs of opposing terminals. It takes a randomly oriented heap of components, properly orients them, presents them to test contactors, and provides a means for sorting the tested parts individually according to test results.

Other advantages and attributes of this invention will be readily discernable upon a reading of the text hereinafter.

SUMMARY OF THE INVENTION

An object of this invention is to provide a handler for components having a plurality of opposing terminals.

A further object of this invention is to provide a component handler that has a significantly increased throughput over prior art handlers.

A further object of this invention is to provide a component handler that can receive a stream of randomly oriented components and automatically: (1) seat each component in a respective test seat properly oriented for testing, (2) simultaneously, electrically couple the plurality of terminals of each seated components to a tester, and (3) subsequently unseat and sort tested components according to test results.

A further object of this invention is to provide a component handler as described above which can create the stream of components from a heap of components.

A further object of this invention is to provide a component handler as described above which includes a loading mechanism to receive the stream of components and individually seat them in a ring of seats defined by a rotating carrier, the ring being concentric with the axis of rotation.

A further object of this invention is to provide a component handler as described above which can simultaneously present a plurality of seated components to a plurality of contactors.

These objects, and other objects expressed or implied in this specification, are accomplished by a component handler having a ring of uniform test seats or notches each for seating a single component; a drive for rotatingly indexing the ring; a loading station, in the path of the rotating ring, for receiving a stream of components and seating them in the ring; a plurality of test stations, in the path of the rotating ring, for electrically contacting each seated component sufficiently for testing same; and a plurality of ejection stations, in the path of the rotating ring, for ejecting the tested components from their test seats and sorting them. Preferably, the ring of test seats is defined by a circular wall projecting perpendicularly from a rotatable carrier plate, each test seat being a component-sized notch in the wall. The test seats are oriented to expose the components' opposing terminals on opposite sides of the wall. Beneath the carrier plate is a stationary plate abutting a planar bottom of the wall. The stationary plate defines a vacuum channel which runs beneath the wall and extends at least from the loading station to the last ejection station. Over the run of the vacuum channel it communicates with the test seats via respective vacuum ports defined by the wall and extending through the wall from the channel to the seats. The vacuum channel communicates with a vacuum source and communicates this vacuum to the test seats via the ports to keep the components seated.

In the preferred embodiment, the wall of test seats is inclined at an angle, preferably about 45 degrees, and is tangentially adjacent a co-planar feed wheel. As will be explained, the tangential adjacency is the "loading station." The feed wheel defines a plurality of uniform singulating structures which are uniformly angularly spaced around the periphery of the wheel. The singulating structures guide randomly tumbling components into respective feed seats which are uniformly angularly spaced around the edge of the feed wheel. As will be explained, the components are individually transferred from a feed seat to a test seat at the loading station. Each singulating structure includes an open-top slot, running radial to the axis of wheel rotation, which slot starts a distance from the wheel margin and open ends into an aligned deeper cavity, a "feed seat," which has an open side to the edge of the plate. The slot and feed seat together form a down facing, rounded "L" groove which serves to properly orient the components for transfer from the feed wheel to the carrier plate. The slots are preferably long enough to hold two or more components in line, but narrow enough to only admit them edge-wise. The components enter the slots by action of gravity, and assisted optionally by vibration of the feed wheel eventually fall from the slots into corresponding feed seats which can only hold one component each. Each feed seat only admits a component if it is properly oriented, namely standing on end with one of the component's terminal edges facing outward, i.e. facing the seat's open side. The handler also includes means for pouring components onto the feed wheel.

The seats of the carrier ring are uniformly, angularly, spaced and the ring is preferably incrementally rotated, the increment of rotation being the angular space between adjacent seats. There are a plurality of rolling contactors on both sides of the wall for coupling the components to a tester. All the contactors are readily replaceable. Tested components pass by an ejection manifold defined by a plurality of ejection holes which register with a set of seats each time the ring is rotated an increment. Ejection tubes are coupled to the ejection holes. The components are ejected from their seats by blasts of air from selectively actuated, respective pneumatic valves. The blast of air and gravity sends the ejected components through the tubes into sorting bins according to test results. The handler further includes a sensor for detecting components that were not ejected.

BRIEF DESCRIPTION OF THE DRAWINGS

FIG. 1 is a pictorial view of an exemplary component which can be handled by this invention;

FIG. 2 is an overall pictorial view of the invention;

DESCRIPTION OF THE PREFERRED EMBODIMENT

Figure 3:
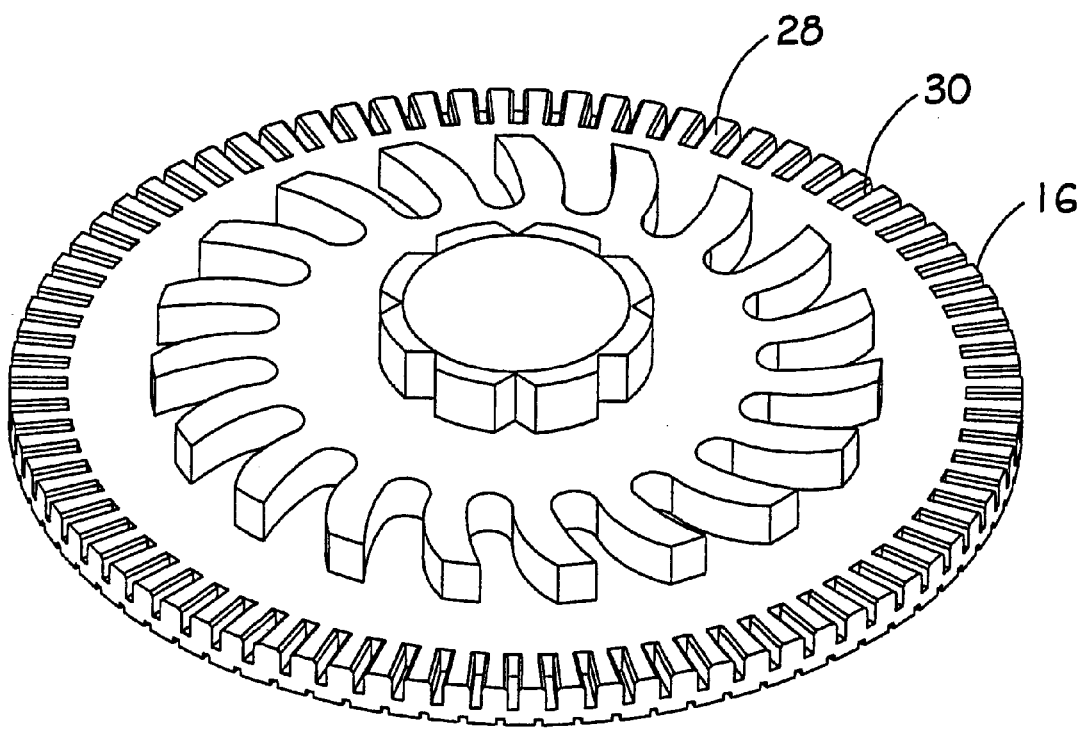
FIG. 3 is a view of a feed plate.

Referring to FIG. 1, an example of a component 2 which can be handled by this invention is illustrated. This particular component is a four-place capacitor having four individual pairs of metal terminations. It is better described as being parallelepiped-shaped having opposite faces, 4A and 4B, normal to four relatively thinner sides. The opposing terminals 6 of the example component are disposed on opposite long thin sides of the component, the "ends" of the component being the shorter thin sides. In this document, the term "edge", when used in reference to a component, shall mean a thin side of the component, not a face, and the term "terminal edge" shall refer to a long thin side of a component on which terminals are disposed.

Referring to FIG. 2, a base 8 supports an inclined (preferably at 45°), rotatable carrier plate 10. Projecting normally from the carrier plate is an upstanding circular wall 12 concentric with the rotational axis of the carrier. Uniformly angularly spaced around the wall are notches 14, i.e. "test seats," defined by the wall, each of which is sized to seat a component to be tested. Preferably carrier plate 10, and thus wall 12, is rotatingly indexed about a hub such that the carrier plate turns (by a drive not shown) in angular steps, each step being the common angle between adjacent test seats.

Also illustrated is a feed wheel 16 which receives a stream of components from a shake chute 18 which in turn is fed heaped components from a hopper 20. As will be explained, feed wheel 16 loads the components into test seat notches 14. As illustrated, carrier plate 10 rotates clockwise, in the direction of the arrow, so that as components 2 are loaded into carrier wall 12, they traverse clockwise to a test fixture, generally designated 22, which includes a plurality of contactors 24. Contactors 24 provide communication between the components' terminals and a parametric tester. After components 2 are tested, they continue to be indexed clockwise to an ejection system, generally designated 26, which ejects the components and sends them down a plurality of ejection tubes based on the test results.

Figure 5:
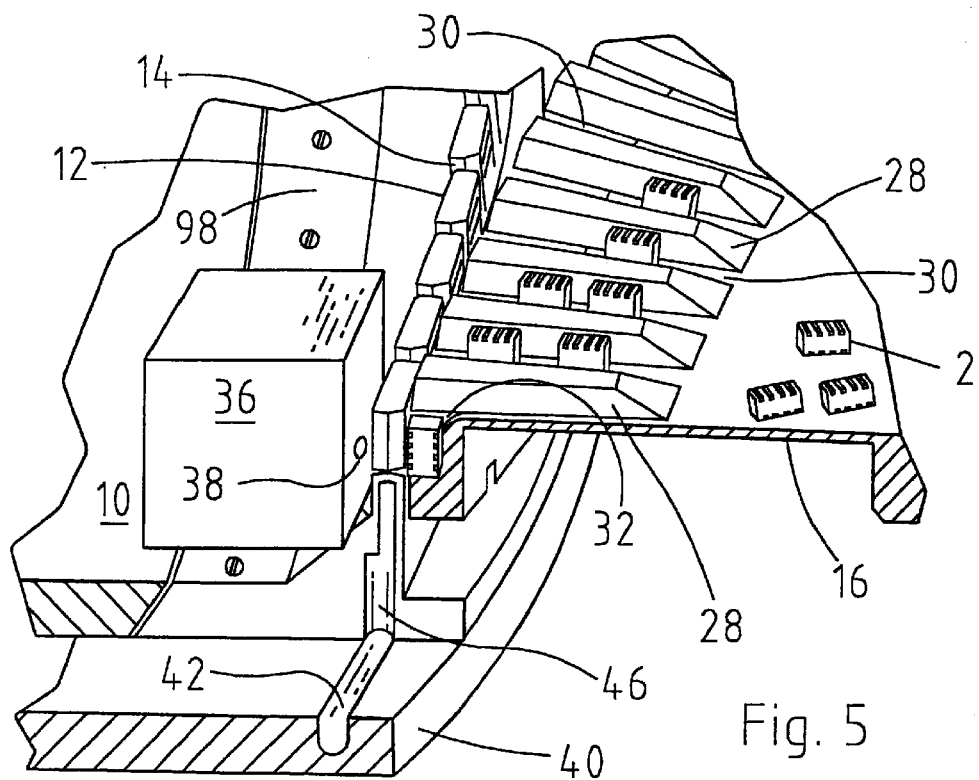
FIG. 5 is a partial cross-section showing a loading station according to this invention.

Referring to FIGS. 2, 3 and 5, feed wheel 16 is circular and has a plurality of elongated, radially-pointing bosses 28 uniformly juxtaposed around its periphery. Each pair of adjacent bosses defines a slot 30 which guides components 2 therein toward the edge of feed wheel 16 where they individually fall into component-sized cavities 32, i.e. "feed seats," defined by wheel 16, each said cavity 32 having an outwardly open side. Slots 30 are preferably long enough to hold two or more components in line, but narrow enough to only admit them edge-wise. The feed seats are sized to only admit one component properly oriented, standing on an end with a terminal edge facing the open side of the feed seat or, put another way, having one terminal edge facing outward from carrier wall 12 and the opposite terminal edge facing inward from carrier wall 12. As illustrated, each slot 30 and its respective feed seat or cavity 32 form a down facing, rounded "L" groove. Slot 30 and feed seat or cavity 32 together comprise a singulating structure to singulate and properly orient tumbling components 2 into cavity 32. The components tumble over the slots because the feed wheel is rotatingly indexed synchronously with the carrier plate 4 and is inclined to the horizontal. The components enter the slots by action of gravity, and are assisted optionally by vibration of feed wheel 16 so that they eventually fall from the slots into corresponding feed seats. A stationary peripheral wall 34 spaced close to the rim or peripheral wall of feed wheel 16 contains all unseated components on the feed wheel, so that, as the wheel rotates, the components tumble over the slots and not out of the feed wheel.

Referring again to FIGS. 2, 3, and especially 5, components are transferred from cavities 32 to test seat notches 14 at a "loading station" which is the point at which carrier plate 10 is tangentially adjacent feed wheel 16. The spacing between the test seats matches the spacing between the feed seats, and carrier plate 10 and feed wheel 16 are indexed synchronously such that each index step brings a test seat notch into alignment with a feed seat cavity at the loading station. Also at the loading station is a vacuum delivery manifold 36 disposed on the inboard side of the carrier wall 12. Manifold 36 defines an orifice 38 aimed and closely spaced to wall 12 at the point of seat alignment. Manifold 36 communicates with a vacuum source (not shown). Each time test seat notch 14 and a feed seat cavity 32 are brought into adjacent alignment, vacuum from orifice 38 draws a component 2 from the feed seat across to the test seat. For clarity of understanding, vacuum delivery manifold 36 is shown spaced from the inside of carrier wall 12, but is actually very close to the inside of the wall to further act as a stop to prevent the component from being drawn beyond its optimal point in the test seat notch.

Figure 4:
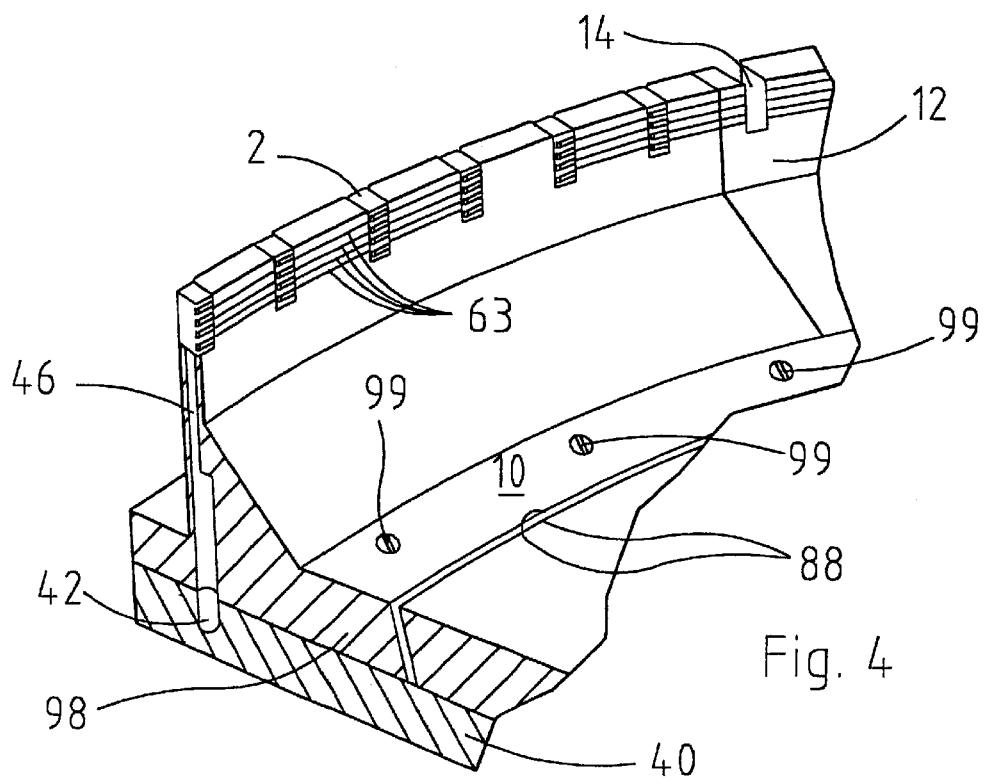
FIG. 4 is a partial cross-section of a carrier plate illustrating a wall of component seats, some of the seats containing components.
Figure 6:
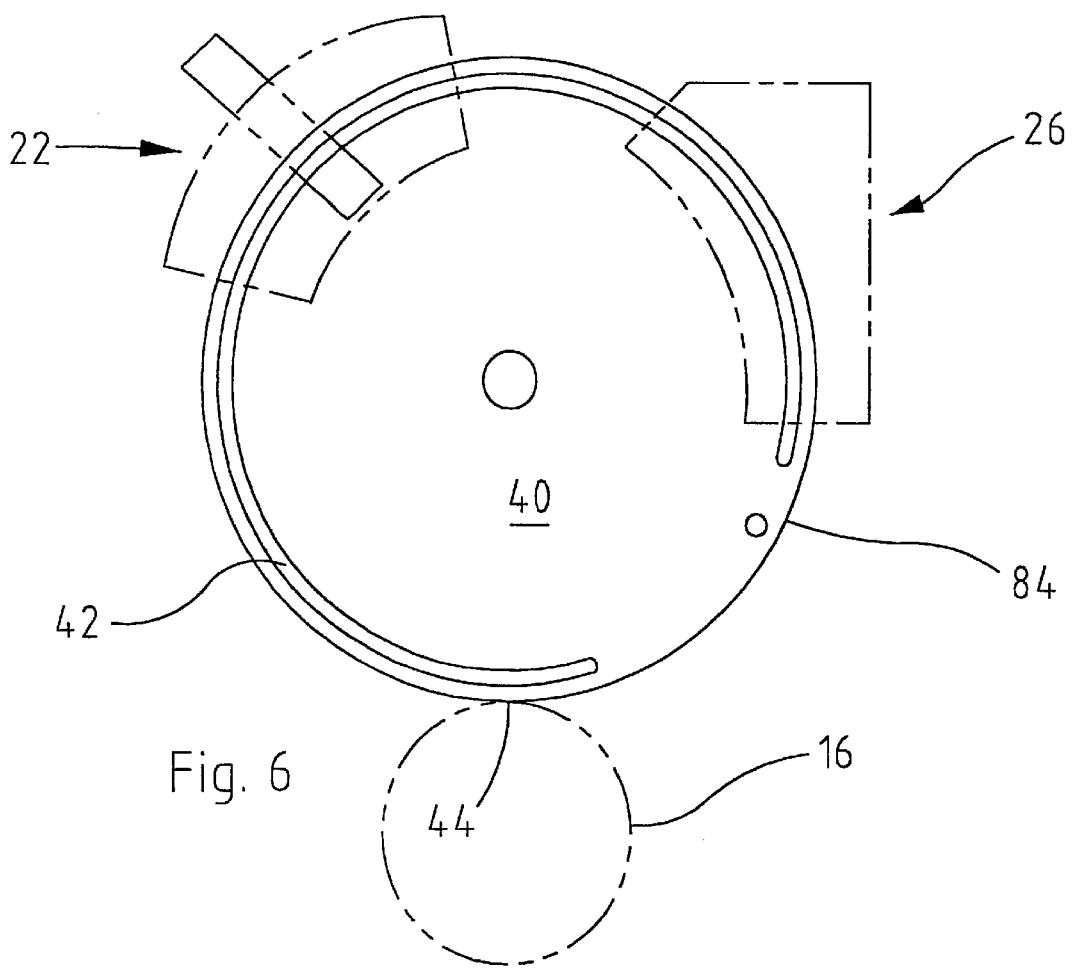
FIG. 6 is a plane view of a stationary plate according to this invention.

Referring to FIGS. 4–6, components 2 are held in their respective test seat notches 14 by gravity and by pressure of a vacuum. Beneath carrier plate 10 is a stationary plate 40 abutting a planar bottom of carrier wall 12. Stationary plate 40 defines a vacuum channel 42 which runs beneath carrier wall 12 and extends at least from the loading station 44 to the last ejection station of the ejection manifold 26. Over the run of vacuum channel 42, it communicates with test seat notches 14 via respective vacuum ports 46 formed in carrier wall 12 and extending through wall 12 from channel 42 to test seat notches 14. Vacuum channel 42 communicates with a vacuum source (not shown) and communicates the vacuum pressure to test seat notches 14 via vacuum ports 46 to help keep the components seated.

Figure 8:
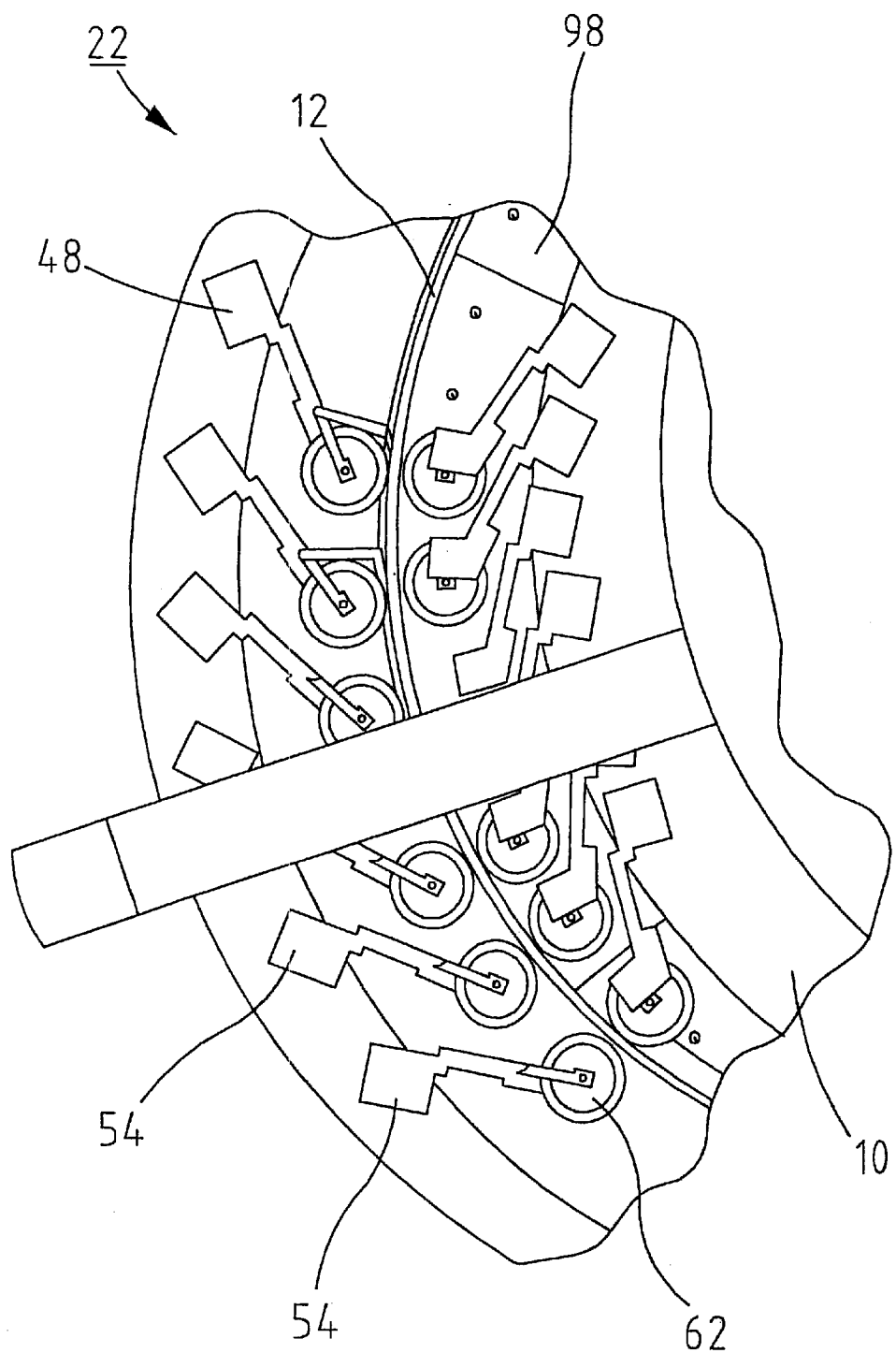
FIG. 8 is a plane view of a plurality of rolling contactors according to this invention.

Referring to FIG. 8, the test fixture 22 is illustrated to have a plurality of test stations, each comprising a pair of opposing contactor modules 48. A number of modules are on the outboard side of the carrier wall 12 for contacting outboard facing component terminals, and a corresponding number of modules are on the inboard side of the wall for contacting inboard facing terminals. The module pairs are so disposed that each time the carrier plate 10 is indexed a certain number of times, a new test seat aligns with each contactor pair. Preferably the test seat notches are separated by 2° while the test stations are separated by 10°. As each test seat moves through the test fixture it is momentarily contacted by each contactor pair. Each contactor communicates with the parametric tester, so a series of tests, e.g. one per test station, can be performed on each component as it steps through the contactor pairs.

Referring to FIGS. 8, 9A–9C and 12, each contactor module 48 includes a mounting bracket 50, a bridge 52 affixed to bracket 50 for holding a plurality of roller assemblies 54, and a roller guide framework 56 also affixed to bracket 50. As illustrated, there are four roller assemblies 54 per side of a component but there may be more or less depending upon the parts being tested. Each roller assembly has a flexible, electrically-conductive shank 58, one end of shank 58 clamped in bridge 52 and the other end having a fork 60 extending therefrom. Bridge 52 is nonconductive and the ends of shanks 58 clamped therein are electrically connected to leads 61 to a tester (not shown). A conductive roller 62 freely rotates about an axle (not shown) journaled in fork 60 of each shank 58, and is electrically connected to shank 58 through fork 60 and the axle. As illustrated, rollers 62 are canted inwardly to conform to the pitch of the terminals of the components 2 that they are contacting.

Figure 9A:
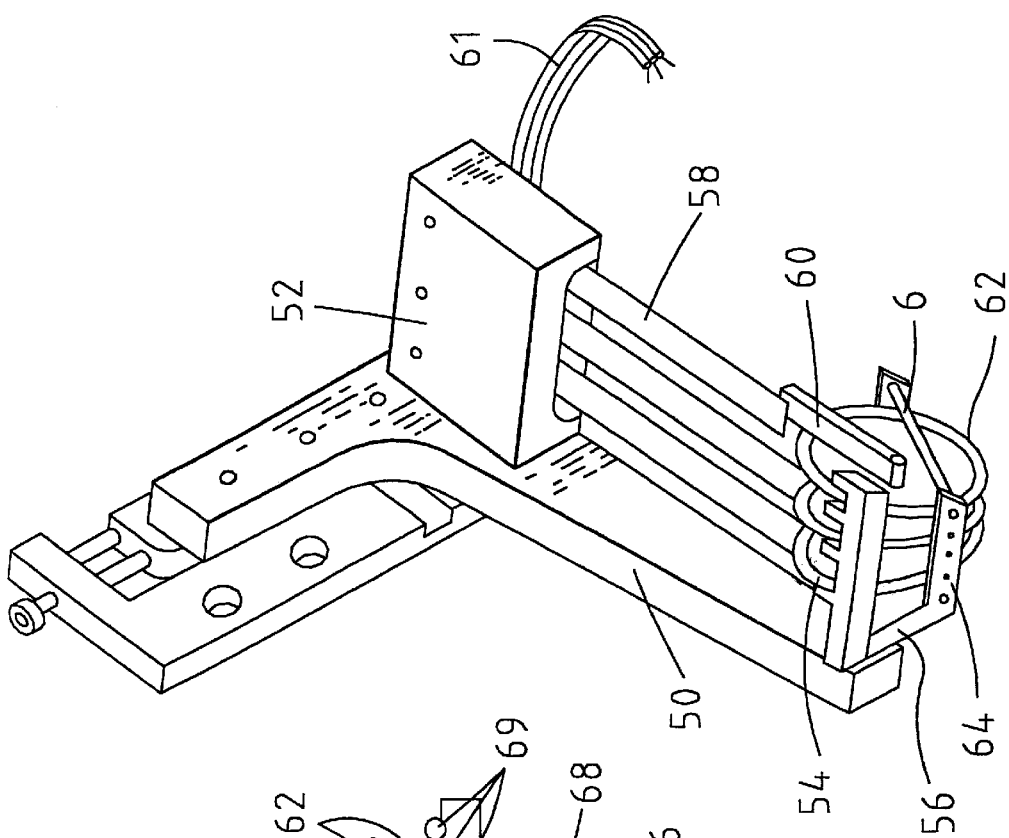
FIG. 9A is a pictorial view of a rolling contactor according to this invention.
Figure 9C:
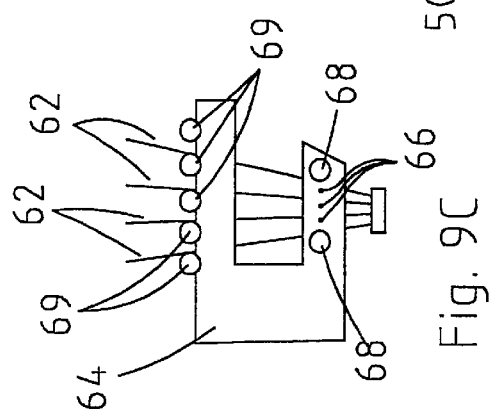
FIG. 9C is a partial front view of the rolling contactor.
Figure 9B:
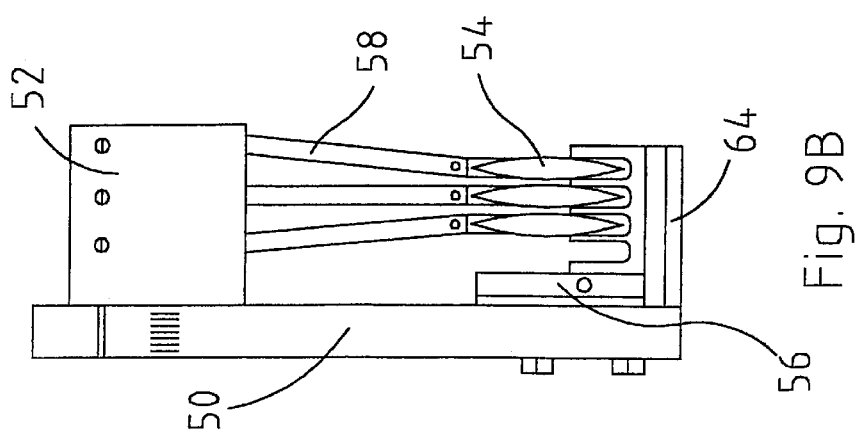
FIG. 9B is a top view of the rolling contactor of FIG. 9A.

FIG. 9C shows the preferred angular relationship of the rollers with respect to a terminal side of a component. The outer two rollers are angled + and −75° from the terminal edge of the component, and the two inner rollers are angled + and −85°. In general, the amount of canting necessary is determined by the widths of the roller assemblies. In operation, rollers 62 roll along in grooves 63 formed on the inside carrier wall 12 and roll along in grooves 64 formed on the outside of carrier wall 12. It has been found beneficial to form outside grooves 64 deeper in carrier wall 12 so that rollers 62 have a deeper area to enter and are better guided than if the grooves were shallow.

Guide framework 56 keeps rollers 62 in their angular relationship when shanks 58 are flexed, as when rollers 62 encounter a seated component. Framework 56 includes a framework bridge 64 extending from the mounting bracket 50, a plurality of finger bars 66 projecting from the bridge between which the rollers move as their shanks are flexed, and a pair of additional limiting bars 68. In addition, a plurality of pivotal spheres 69, each mounted on a fixed shaft (not shown) are placed between each roller 62 to further insure electrical isolation and provide general guidance to the rollers. Guide framework 56 is electrically isolated (each roller is electrically isolated).

Referring to FIGS. 9A and 13A, 13B, 13C, and 13D, a micro-adjusting device 70 is shown placed between bracket 50 and carrier plate 10. Micro-adjusting device 70 makes very small changes in the pitch, pressure and operation of a contactor module 48 so that it will contact the requisite metal termination on the component with the proper pressure and give a positive result in the electronic tester. Micro-adjusting device 70 comprises a base plate 71 having two holes 72 formed therethrough for receipt of bolts (not shown) to attach plate 71 to the surface of carrier plate 10. An adjustment plate 73 is placed adjacent base plate 71 and held in sliding relationship therewith by a slot-pin attachment 74 and a pair of guide pins 75a and 75b received in guide pin bores (not shown) formed in upwardly extending spaced-apart ears 76 formed on base plate 71. Adjustment plate 73 is attachable to bracket 50 by a pair of spaced-apart pins 77 receivable in a like spaced of similarly sized holes (not shown) formed in bracket 50. An adjustment screw 78 is threadably received in a bore (not shown) in one of ears 76 on base plate 71 and bears against one edge of adjustment plate 73 for turning to move adjustment plate 73 relative to base plate 71 and adjust the position of a roller 62 in a groove 63 or 64. Adjustment plate 73 is biased by a spring 79 so that movement of adjustment screw 78 in either direction will produce positive motion of plate 73 vis-a-vis base plate 71.

Figure 10:
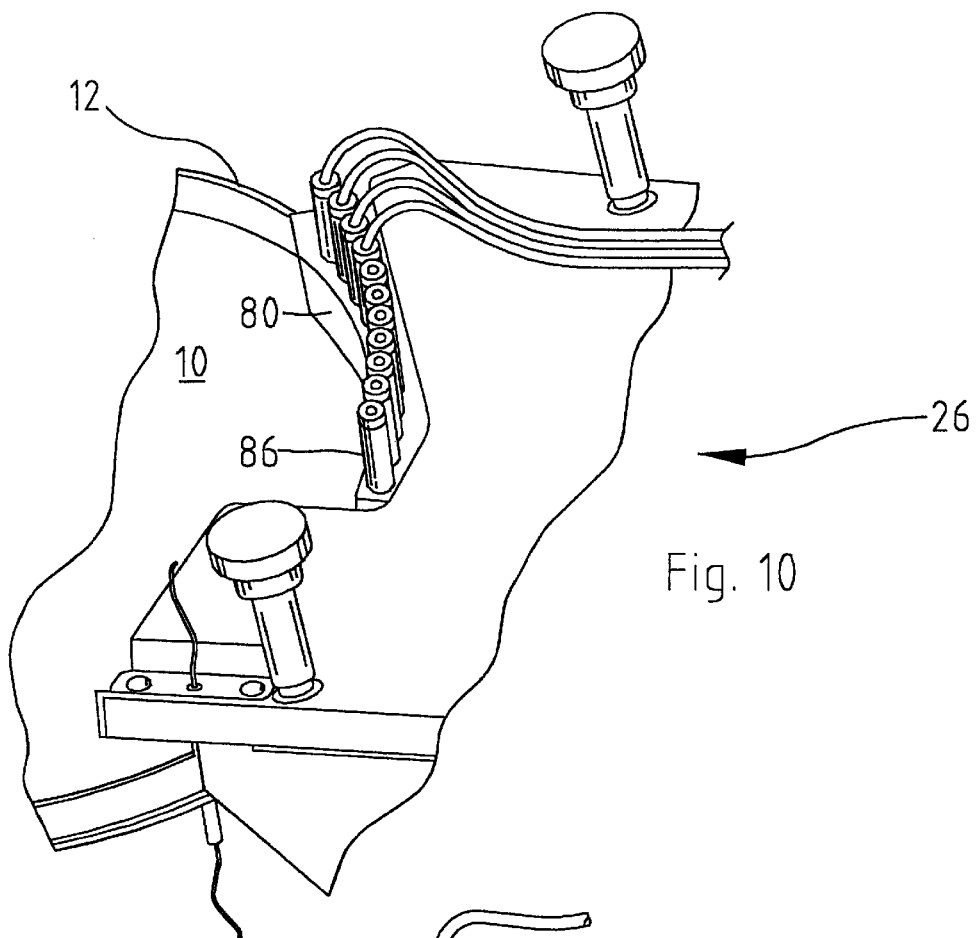
FIG. 10 is a pictorial view of an ejection station according to this invention.
Figure 11:
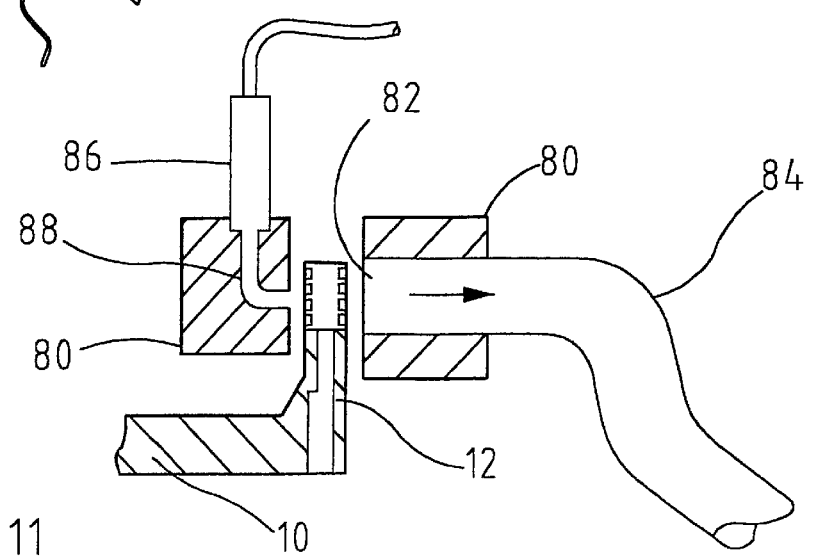
FIG. 11 is a cross-section illustrating the process by which a component is ejected from its seat.
Figure 12:
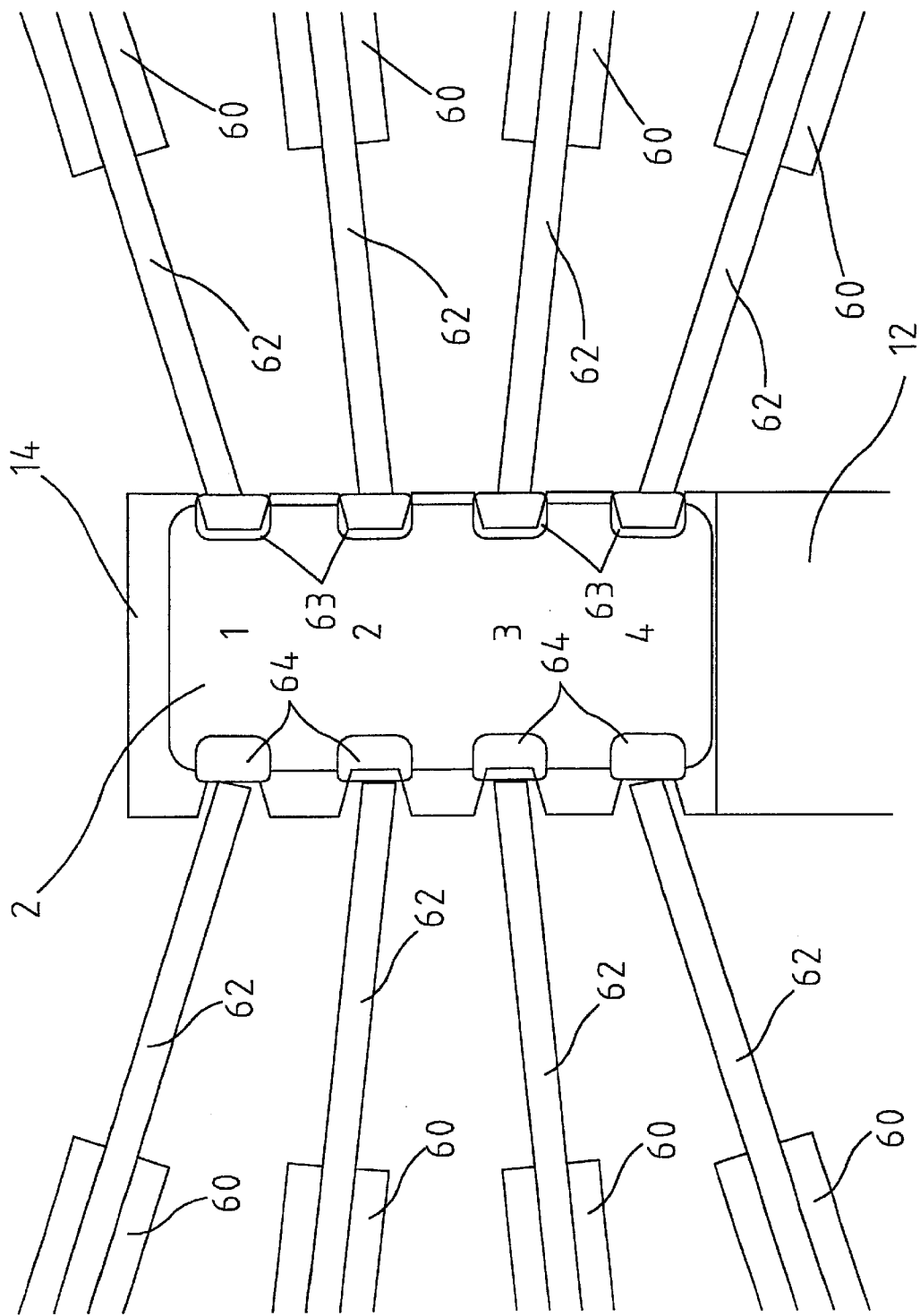
FIG. 12 is a cross-sectional view of a component residing in a test seat notch and contacted by four inner rollers and four outer rollers.
Figure 13A:
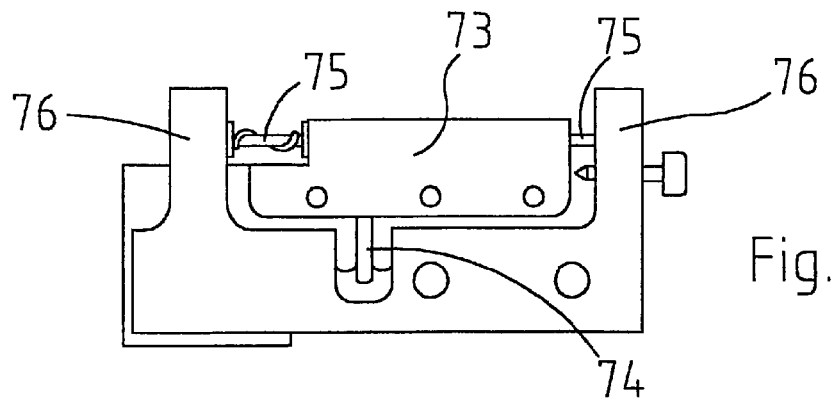
FIG. 13A is a left side view of the micro-adjusting device used in this invention.
Figure 13B:
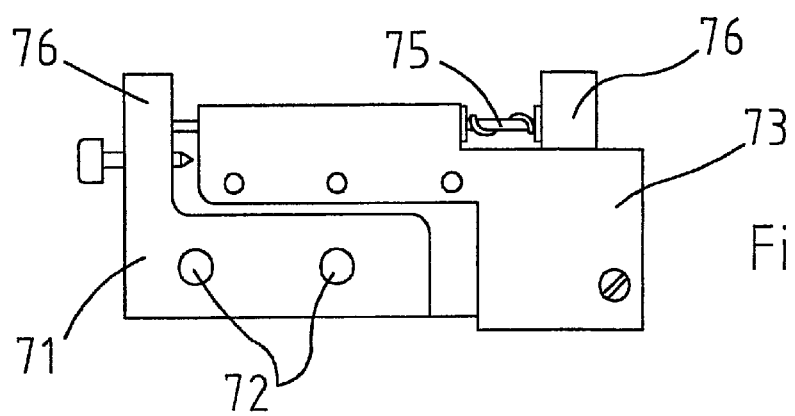
FIG. 13B is a right side view of the micro-adjusting device used in this invention.
Figure 13C:
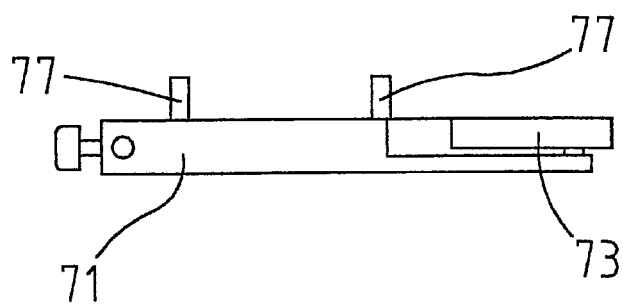
FIG. 13C is a top plan view of the micro-adjusting device used in this invention; and, FIG. 13D is a bottom plan view of the micro-adjusting device used in this invention.
Figure 13D:
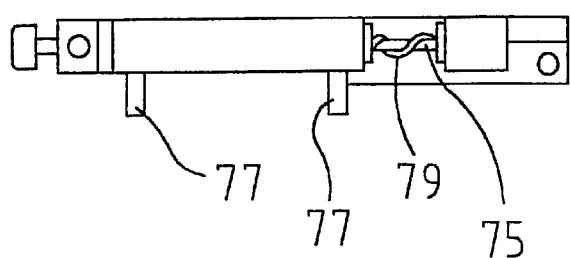

Referring to FIGS. 10 and 11, an ejection system 26 includes an ejection manifold 80 which defines a plurality of ports 82 for coupling a plurality of ejection tubes 84. Ports 82 register with a set of test seat notches 14 each time the ring is rotated an increment. Components 2 are ejected from their seat notches 14 by blasts of air from selectively actuated, respective pneumatic valves 86. A plurality of valves 86 are coupled to respective ports 82 by a short passageway 88 and defined by a pressure manifold 80 which is disposed on the inboard side of the carrier wall 12. The outlet of each port 82 is aligned with an ejection tube 84. Due to the blast of air and gravity, the ejected components 2 are forced from their test seat notches 14 into respective tubes 84, and are directed by the tubes into respective sorting bins (not shown). By this arrangement a tester can selectively send a tested component down any of the tubes according to its test results.

Figure 7:
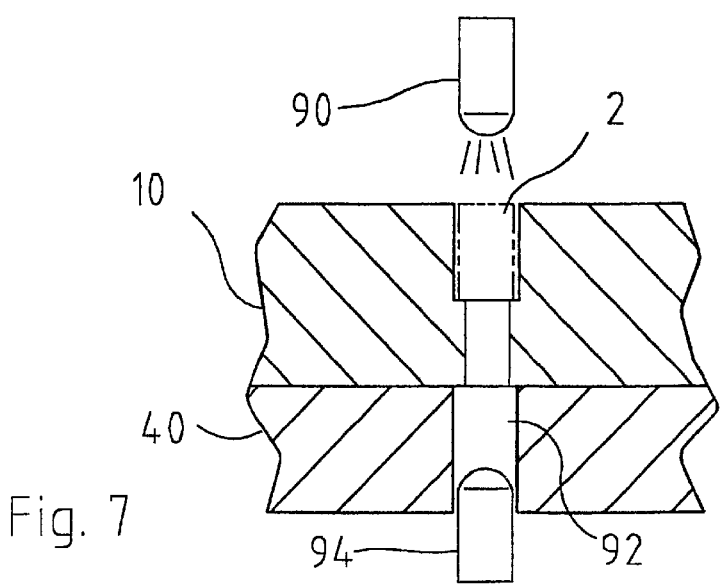
FIG. 7 is a cross-section illustrating an un-ejected component sensor according to this invention.

Referring to FIGS. 7 and 10, the handler further includes a sensor for detecting components that were not ejected, as well as any debris that may be at the vacuum hole in the test seat of the carrier plate. The sensor includes a light source 90 above the path of the test seats and shining down onto each seat as they are indexed below the light. Aligned with the light is a through-hole 92 defined by the stationary plate, and disposed in the hole, or just below it, is a light detector 94. The test seats are indexed between the light and the detector. If a seat is empty the detector will see light shining through the test seat notch 14 and through the hole 92. If the test seat notch is still occupied the light path will be blocked, which will indicate to the tester that a component or some debris is still in the notch. The seat can then be manually or automatically cleared, or subsequent loading of that position can be omitted.

Circular wall 12 is subject to severe stress because the ceramic components are extremely hard and brittle and, when they get caught in an atypical position in test seat notches 14, they tend to damage wall 12, in the area about said notch, and can cause damage to roller assemblies 54 when passing through the test site. When this happens, wall 12 often becomes damaged to the extent that the unit must be shut down and the wall repaired. Wall 12 is itself brittle and cannot abide much distortion such as from a ceramic component becoming stuck in a test seat notch. Accordingly, as shown in FIG. 4, marginal edges 88 are struck in carrier plate 10 and circular wall 12 to allow breakout of a damaged piece of wall 12 and/or carrier plate 10 so that another, replacement wall segment can be positioned therein and screwed or bolted at different locations 99 therein to the balance of wall 12 and/or plate 10 to make the repair without recourse to an entirely new wall or plate. Similarly, roller assemblies 54 may be replaced should they be damaged by passage of an atypical ceramic component 2 in test seat notch 14 or by passage of a damaged wall or carrier plate.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

What is claimed is:

1. A high-speed handler for receiving a heap of randomly oriented parallel-piped-shaped ceramic components, each component of the type having at least one set of metal terminations located on opposite edges thereof, presenting them in individual seats in controlled orientation for electrical parametric testing, and sorting them according to their test results, comprising:
    a) a rotating feed wheel, mounted on a central shaft and defined by an outer rim concentric with the axis of said central shaft, said wheel inclined to the horizontal and including an upper surface on which to receive a heap of randomly oriented ceramic components;
    b) a plurality of radially-pointing, spaced-apart bosses extending upward and outward on said upper wheel surface terminating at component-sized cavities formed in said wheel adjacent said outer rim and arranged to receive therein a single ceramic component in specific orientation;
    c) a rotating carrier plate mounted planar to, and spaced-apart from, said feed wheel having an upwardly extending circular peripheral wall arranged in tangential adjacency and synchronous peripheral velocity with said feed wheel;
    d) said peripheral wall having formed therein a plurality of test seat notches in spaced-apart arrangement and adjacent alignment with said cavities in said feed wheel, said notches of a size and shape to receive a ceramic component therein with its opposed terminals facing inward and outward from said wall;
    e) first vacuum pressure means to draw the ceramic component radially from said cavity into said test seat notch and second vacuum pressure means to hold said component in said test seat notch during further rotation of said carrier plate;
    f) means for testing including at least one roller assembly arranged to contact the terminals of the ceramic components as they are moved in said test seat notches on said carrier plate; and,
    g) means for separately ejecting the ceramic components from said test seat notches and transferring them to separate locations according to their test results.

2. The high-speed handler of claim 1 wherein said parallelepiped-shaped ceramic components are flirter defined by having opposite faces, normal to four relatively thinner edges, wherein the terminals are disposed on opposite long thin side edges of the component between shorter, spaced-apart end edges.

3. The high-speed handler of claim 2 wherein said component-sized cavities, formed in said wheel adjacent said outer rim and arranged to receive therein a single ceramic component in specific orientation, include an outwardly-facing open side, and said cavities are each arranged to receive therein one ceramic component standing on an end edge with a terminal edge facing said open side of said cavity and said open side of said test seat notches when one said cavity and one said test seat notch come into aligned adjacency.

4. The high-speed handler of claim 1 wherein said rotating feed wheel is inclined at an angle of 45° to the horizontal.

5. The high-speed handler of claim 1 wherein said plurality of radially-pointing, spaced-apart bosses extending upward and outward on said upper wheel surface of said feed wheel are uniformly juxtaposed around said rim.

6. The high-speed handler of claim 5 wherein each pair of adjacent bosses define a slot which guides the ceramic components toward said outer rim of said feed wheel.

7. The high-speed handler of claim 1 wherein said plurality of radially-pointing, spaced-apart bosses extending upward and outward on said upper wheel surface of said feed wheel are long enough to hold two or more ceramic components in line, but narrow enough to only admit them edge-wise.

8. The high-speed handler of claim 1 further including a stationary peripheral wall surrounding the sides and lower part of said outer rim of said inclined feed wheel to retain the ceramic components on said upper surface thereof and prevent them from spilling off said upper surface as said feed wheel rotates with a heap of ceramic components loaded thereon.

9. The high-speed handler of claim 1 wherein the spacing between said test seat notch matches the spacing between said cavity and said carrier plate and said feed wheel are indexed synchronously such that each index step brings a test seat notch into alignment with a cavity.

10. The high-speed handler of claim 1 wherein said first vacuum pressure means, to draw the ceramic component radially from said cavity into said test seat notch, comprises:
    a) a vacuum nozzle disposed on the inboard side of said carrier plate close to said carrier plate wall; and,
    b) an orifice defined by said vacuum nozzle to communicate with a vacuum source, said orifice being smaller in overall size that the ceramic component;
    c) said orifice arranged to draw a ceramic component from said cavity to said test seat notch and not beyond.

11. The high-speed handler of claim 1 wherein said second vacuum pressure means, to hold said component in said test seat notch during further rotation of said carrier plate, comprises:
    a) a stationary vacuum plate located beneath said rotating carrier plate;
    b) said vacuum plate defining a vacuum channel circularly thereabout running beneath said wall from at least said point of transfer, of the ceramic component from said cavity in said feed wheel to said test seat notch, to the location where said means ejects the ceramic component from said test seat notch;
    c) wherein said circular peripheral wall has formed therein a vacuum port, communicating said vacuum channel and said test seat notch for applying vacuum pressure to hold the oriented ceramic component in said notch.

12. The high-speed handler of claim 11 further including a sensor for detecting components and debris that were not ejected from said test seat notches by said ejection means, said sensor comprising:
    a) a light source positioned above the path of said test seat notches and arranged to shine light down into each said notch;
    b) said stationary vacuum plate forming a straight through-hole for alignment with a test seat notch as it is indexed along with rotation of said carrier plate after passing through said ejection means;
    c) a light detector aligned with said light source and said through-hole whereupon said detector will detect any blockage of light passing from said source through said hole and into said detector caused by a ceramic component or debris; and, d) safety means for preventing said blockage from interfering with operation of said handler.

13. The high-speed handler of claim 1 wherein said means for testing a ceramic component include at least one pair of opposing contactor modules wherein each module comprises:

a) a mounting bracket;
   b) a non-electrically conductive bridge affixed to said bracket for holding a plurality of roller assemblies; and,
   c) a roller guide framework affixed to said bracket.

14. The high-speed handler of claim 13 wherein each said roller assembly comprises:

a) a flexible, electrically conductive shank having first and second terminal ends wherein said first end thereof is clamped in said bridge and said second end has a fork extending therefrom;
   b) an electrical lead extending from said first shank end to said means for testing the ceramic components; and,
   c) a conductive roller pivotally mounted on an axle journaled in said fork and electrically connected to said shank, said roller canted inwardly to conform to the pitch of the terminals of the ceramic components that it is contacting.

15. The high-speed handler of claim 14 wherein said roller guide framework comprises:

a) a framework bridge extending from said mounting bracket;
   b) a plurality of finger bars projecting from said bridge between which said rollers move as their shanks are flexed; and,
   c) a pair of limiting bars extending from said framework bridge to electrically isolate each said roller.

16. The high-speed handler of claim 13 further including a micro-adjusting device for making very small changes in the pitch, pressure and operation of said contactor module, said micro-adjusting device comprising:

a) a base plate having hole means formed therethrough for attachment to the upper surface of said carrier plate;
   b) an adjustment plate placed adjacent said base plate and held in sliding relationship therewith;
   c) a pair of guide pins received in guide pin bores formed in upwardly extending spaced-apart ears formed on said base plate;
   d) a pair of spaced-apart pins receivable in a like spaced of similarly sized holes formed in said bracket; and,
   e) an adjustment screw threadably received in one of said ears for bearing against one edge of said adjustment plate to move said adjustment plate relative to said base plate and adjust the position said contactor module on said carrier plate.

17. The high-speed handler of claim 1 wherein said means for separately ejecting the ceramic components, from said test seat notches and transferring them to separate locations according to their test results, comprises:

a) a high-pressure pneumatic ejection manifold defining a plurality of ports arranged to register with a set of said test seat notches each time said carrier plate is rotated an increment;
   b) a plurality of ejection tubes, each defined by first and second spaced-apart terminal ends, wherein said first terminal end of each said tube is arranged on the opposite side of a test seat notch connected from a port;
   c) a plurality of open-close air valves interposed said manifold and said ports and arranged to allow a blast of high-pressure air from said manifold through said valve, said port and said tube, upon command, to dislocate a ceramic component from said test seat notch and move it through said tube; and,
   d) a plurality of sorting bins connected to said tubes and arranged to collect ceramic components from said ejection means according to the results of said tests.

18. The high-speed handler of claim 1 further including a sensor for detecting components that were not ejected by said means for separately ejecting the ceramic components from said test seat notches, comprising:

a) a light source arranged above the path of said test seat notches and shining down onto each seat as they are indexed below the light;
   b) a through-hole aligned with said light as each said test seat notch is indexed there below;
   c) a light detector for detecting light from said light source if said test seat notch is empty or for not detecting light if said test seat notch is occupied; and,
   d) means for clearing said test seat notch if it is detected as occupied when it should not be occupied so as to prevent damage to said carrier plate.

* * * * *

UNITED STATES PATENT AND TRADEMARK OFFICE
CERTIFICATE OF CORRECTION

PATENT NO. : 6,204,464 B1
DATED : March 20, 2001
INVENTOR(S) : Douglas J. Garcia et al.

It is certified that error appears in the above-identified patent and that said Letters Patent is hereby corrected as shown below:

<u>Column 7,</u>
Line 53, change "flirter" to -- further --

Signed and Sealed this

Nineteenth Day of March, 2002

Attest:

JAMES E. ROGAN
*Director of the United States Patent and Trademark Office*

*Attesting Officer*